(12) United States Patent
Nagashima et al.

(10) Patent No.: US 7,483,470 B2
(45) Date of Patent: Jan. 27, 2009

(54) SEMICONDUCTOR LASER CAPABLE OF COUPLING WITH SINGLE MODE OPTICAL FIBER AT HIGH COUPLING EFFICIENCY

(75) Inventors: Yasuaki Nagashima, Atsugi (JP); Atsushi Yamada, Atsugi (JP); Yoshiharu Shimose, Atsugi (JP); Tomoyuki Kikugawa, Atsugi (JP)

(73) Assignee: Anritsu Corporation, Tokyo (JP)

( * ) Notice: Subject to any disclaimer, the term of this patent is extended or adjusted under 35 U.S.C. 154(b) by 337 days.

(21) Appl. No.: 10/553,161

(22) PCT Filed: Mar. 15, 2005

(86) PCT No.: PCT/JP2005/004556

§ 371 (c)(1),
(2), (4) Date: Oct. 14, 2005

(87) PCT Pub. No.: WO2005/088791

PCT Pub. Date: Sep. 22, 2005

(65) Prior Publication Data

US 2006/0285560 A1    Dec. 21, 2006

(30) Foreign Application Priority Data

Mar. 16, 2004    (JP) .............................. 2004-074636

(51) Int. Cl.
H01S 3/098    (2006.01)
H01S 3/08    (2006.01)

(52) U.S. Cl. ........................................ 372/108; 372/19

(58) Field of Classification Search .................. 372/19, 372/39, 43.01, 45.012, 54, 66, 103, 108
See application file for complete search history.

(56) References Cited

U.S. PATENT DOCUMENTS

| 6,333,945 | B1 | 12/2001 | Abe et al. |
| 6,606,334 | B1 | 8/2003 | Shigihara et al. |
| 2002/0041613 | A1 | 4/2002 | Yoshida et al. |
| 2004/0089866 | A1 | 5/2004 | Nagashima et al. |

FOREIGN PATENT DOCUMENTS

EP    1 416 598 A2    5/2004

(Continued)

OTHER PUBLICATIONS

Y. Nagashima et al, Asymetric Cladding 1480-NM Pump Laser With CW Fiber Output of 1 W, Optical Amplifiers and Their Applications, Tops (2) vol. 92 147, 2003.*

(Continued)

*Primary Examiner*—Armando Rodriguez
(74) *Attorney, Agent, or Firm*—Frishauf, Holtz, Goodman & Chick, P.C.

(57)    ABSTRACT

A semiconductor laser includes a substrate made of InP, an active layer including a multiquantum well structure, which is formed in a width of 7 to 14 μm on the substrate, and an n-type cladding layer made of InGaAsP and a p-type cladding layer made of InP, which are formed on the substrate with the active layer interposed therebetween. The semiconductor laser oscillates only in the fundamental lateral mode, and light emitted from an exit facet can be optically coupled with an external single mode optical fiber.

17 Claims, 12 Drawing Sheets

FOREIGN PATENT DOCUMENTS

| | | | |
|---|---|---|---|
| JP | 8-234062 A | | 9/1996 |
| JP | 9-61652 A | | 3/1997 |
| JP | 09-289354 | * | 4/1997 |
| JP | 9-289354 A | | 11/1997 |
| JP | 11-243259 A | | 9/1999 |
| JP | 2001-210910 A | | 8/2001 |
| JP | 2002-368341 A | | 12/2002 |
| JP | 2004-153212 A | | 5/2004 |

OTHER PUBLICATIONS

Y. Nagashima et al; Asymmetric-Cladding 1480-nm Pump Laser With CW Fiber Output Power of 1 W; Optical Amplifiers and Their Applications; Tops (2) vol. 92 147, 2003; pp. 4-8.

Y. Nagashima et al; Novel Asymmetric-Cladding 1.48-μm Pump Laser With Extremely High Slope Efficiency and CW Output Power of >1 W; Leos (1); 2002; pp. 2-3.

International Preliminary Report on Patentability, Chapter I of the Patent Cooperation Treaty, and Written Opinion, dated Sep. 28, 2006, for PCT/JP2005/004556, 6 sheets.

* cited by examiner

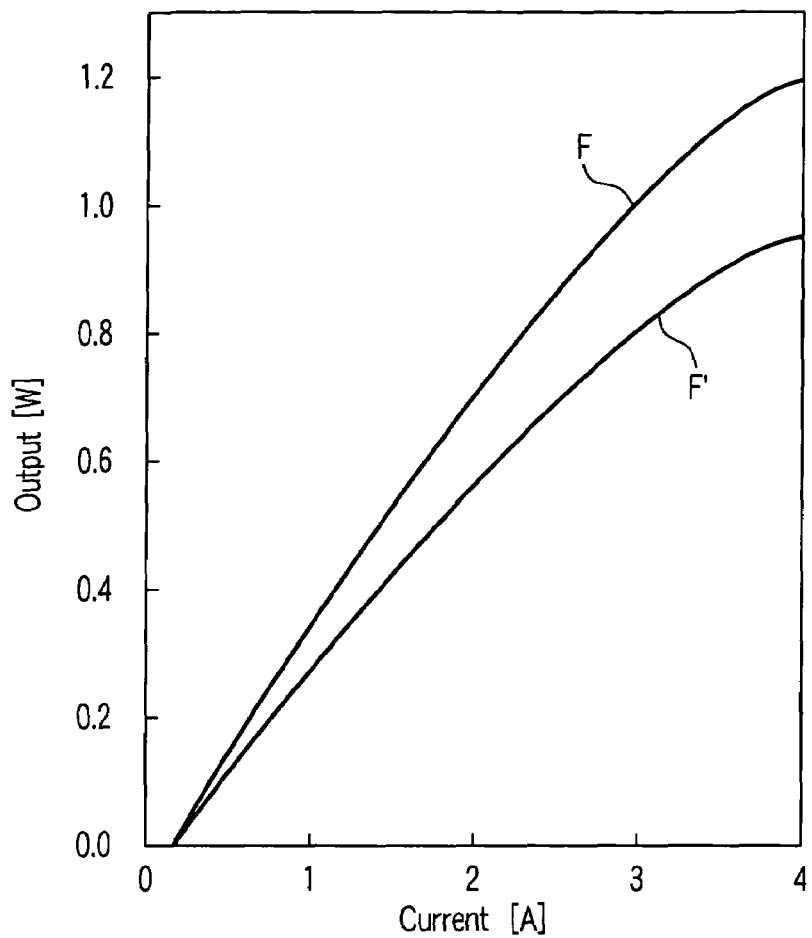
F I G. 11
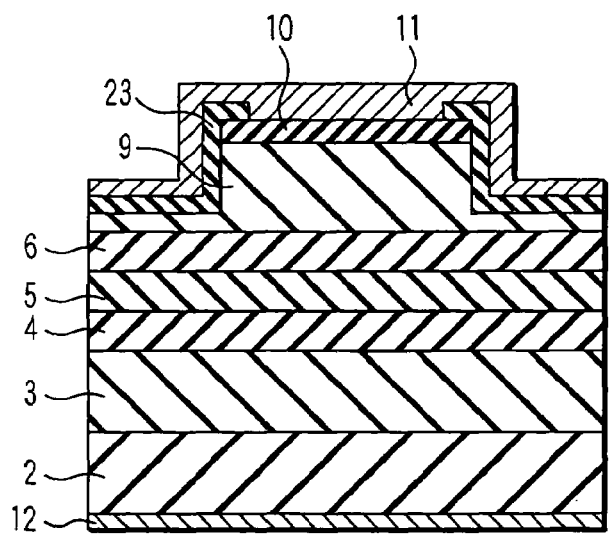
F I G. 12

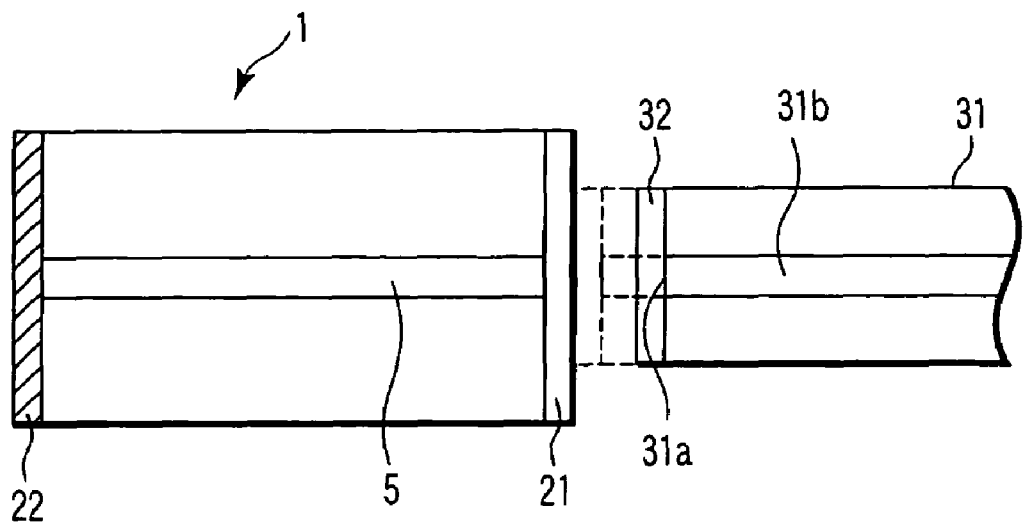
F I G. 15
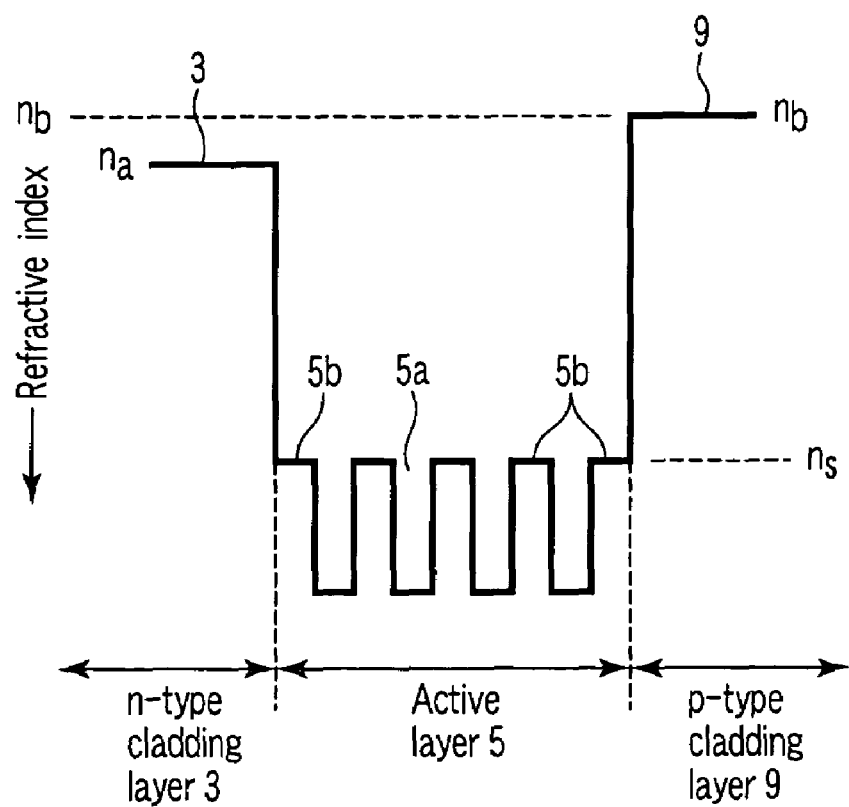
F I G. 16

US 7,483,470 B2

SEMICONDUCTOR LASER CAPABLE OF COUPLING WITH SINGLE MODE OPTICAL FIBER AT HIGH COUPLING EFFICIENCY

This application is a U.S. National Phase Application under 35 USC 371 of International Application PCT/JP2005/004556 filed Mar. 15, 2005.

TECHNICAL FIELD

The present invention relates to a semiconductor laser, and more particularly to a semiconductor laser capable of coupling with a single mode optical fiber at high coupling efficiency.

BACKGROUND ART

An optical signal for use in an optical communication system is transmitted in an optical fiber laid down over a long distance. Hence, as the characteristic of a semiconductor laser used as a light source of the light, high output and high stability are required.

When a single mode optical fiber is used in transmission of an optical signal, the semiconductor laser as a light source and the single mode optical fiber are coupled optically.

However, when a device end face of the semiconductor laser and a light incident plane of the optical fiber are directly coupled by means of butt joint, the light wave spot size of the semiconductor laser is 2 to 3 µm while the spot size of the single mode optical fiber is about 10 µm, so that coupling loss occurs due to difference in light wave spot size between mutual optical waveguides.

Generally, therefore, it is attempted to reduce the coupling loss by converting the laser light from the semiconductor laser into the spot size of the optical fiber by using a lens.

In the configuration using a lens in optical coupling, however, it requires complicated optical axis adjustment between the semiconductor laser and the optical fiber, and the number of optical components is increased.

To solve these problems, there has been proposed a semiconductor optical device capable of coupling optically with a single mode optical fiber by using a lens as disclosed in the following patent document 1.

FIG. 17 is a perspective view showing a schematic configuration of the semiconductor optical device disclosed in patent document 1.

As shown in FIG. 17, a semiconductor optical device 51 disclosed in patent document 1 comprises components 52 necessary for forming devices such as a cladding, a cap and an electrode, in which a multiquantum well (MQW) active layer 53 is coupled to a taper optical waveguide 55 by way of a butt joint part 54.

The MQW active layer 53 is a distortion super-grating active layer, which composes an active region 56. The light waveguide 55 is a light waveguide whose layer thickness and band gap wavelength are continuously changed, and composes a spot size conversion region 57.

In the case of coupling optically with a single mode optical fiber by using the semiconductor optical device 51, laser light emitted from the active region 56 of the MQW active layer 53 is propagated to the spot size conversion region 57 of the taper light waveguide 55 through the butt joint part 54, is converted in the spot size in the spot size conversion region 57, and is emitted from a light exit facet 55a.

The laser light converted in spot size is input into the light incident plane of the single mode optical fiber from the light exit facet 55a, and thereby the semiconductor optical device 51 and the single mode optical fiber are optically coupled. Patent document 1: Jpn. Pat. Appln. KOKAI Publication No. 9-61652

However, in the conventional semiconductor optical device 51 having the taper light waveguide 55 disclosed in patent document 1, the taper light waveguide 55 must be formed integrally with the semiconductor optical device 51 so that the spot size of the laser light emitted from the light exit facet 55a is matched with the spot size of the single mode optical fiber. Therefore, it is hard to design, it takes much time and labor in manufacture, and repeatability of manufacture is poor.

Incidentally, by expanding the width of the active layer of the semiconductor laser, the spot diameter of the laser light emitted from the semiconductor laser can be adjusted to the core diameter of the single mode optical fiber.

However, by merely expanding the width of the active layer of the semiconductor laser alone, a lateral harmonic mode is generated in the laser light emitted from the semiconductor laser, so that a discontinuous point is formed as regards the current-light output characteristic, and coupling loss is increased at the time of optically coupling with the single mode optical fiber, which poses a new problem.

The present inventors or the like previously disclosed, in U.S. patent application Ser. No. 10/692,125 and European patent application No. 03 025 058.3, a semiconductor light emitting device applicable to a semiconductor laser, which is capable of obtaining a light output of higher power in a simple configuration, and expanding the maximum width of an active layer that can suppress a lateral harmonic mode because an n-type cladding layer is made of InGaAsP having larger refractive index than a p-type cladding layer made of InP.

These prior applications, however, does not suppose that a semiconductor laser and a single mode optical fiber are optically coupled without using a lens in order to transmit an optical signal from the semiconductor laser as a light source as considered in the present invention, and thus, the expandable width of the active layer is 3.5 µm or more, and 4.0 µm at maximum.

Therefore, if the semiconductor light emitting device disclosed in these prior applications is applied in a semiconductor laser as a light source used in an optical communication system, the expandable width of an active layer is 3.5 µm to 4.0 µm at most. Consequently, it is not realistic from the viewpoint of coupling loss to couple the semiconductor laser and a single mode optical fiber optically without using a lens.

DISCLOSURE OF INVENTION

The invention has been devised in light of the above problems, and it is hence a primary object of the invention to provide a semiconductor laser capable of coupling laser light of high output with a single mode optical fiber at high coupling efficiency at low cost while maintaining a fundamental lateral mode, without requiring any lens as required in the prior art or other spot size converters when coupling optically with the single mode optical fiber.

In order to achieve the above object, according to a first aspect of the present invention, there is provided a semiconductor laser comprising:

a substrate (2) made of InP;

an active layer (5) including a multiquantum well structure formed above the substrate (2) in a width of 7 to 14 µm; and an n-type cladding layer (3) made of InGaAsP and a p-type cladding layer (9) made of InP which are formed above the substrate (2) with the active layer interposed therebetween, wherein light which oscillates only in a fundamental lateral mode to be emitted from an exit facet is optically coupled with an external single mode optical fiber (31).

In order to achieve the above object, according to a second aspect of the present invention, there is provided a semiconductor laser according to the first aspect, wherein the light emitted from the exit facet is optically coupled with the external single mode optical fiber without resort to lens.

In order to achieve the above object, according to a third aspect of the present invention, there is provided a semiconductor laser according to the first aspect, wherein the light emitted from the exit facet is optically coupled with the external single mode optical fiber by butt joint.

In order to achieve the above object, according to a fourth aspect of the present invention, there is provided a semiconductor laser according to the first aspect, further comprising:

a first separate confinement heterostructure (SCH) layer (4) made of InGaAsP, which is formed between the active layer and the n-type cladding layer; and a second SCH layer (6) made of InGaAsP, which is formed between the active layer and the p-type cladding layer.

In order to achieve the above object, according to a fifth aspect of the present invention, there is provided a semiconductor laser according to the fourth aspect, wherein the first SCH layer includes a multilayer structure formed of a plurality of layers ($4a$, $4b$, $4c$, ... $4N$), and the second SCH layer includes a multilayer structure formed of a plurality of layers ($6a$, $6b$, $6c$, ... $6N$).

In order to achieve the above object, according to a sixth aspect of the present invention, there is provided a semiconductor laser according to the fifth aspect, wherein assuming that a refractive index of a plurality of partition layers in the active layer is ns;

that a refractive index and thickness of the plurality of layers in the first SCH layer are $n1, n2, n3, \ldots, nN$ and $t1, t2, t3, \ldots, tN$, respectively, sequentially from a side closer to the active layer; and that a refractive index and thickness of the plurality of layers in the second SCH layer are $n1, n2, n3, \ldots, nN$ and $t1, t2, t3, \ldots, tN$, respectively, sequentially from the side closer to the active layer, a relationship of the thicknesses of the layers is mutually uniform, being set in a relation of:

$$t1=t2=t3=,\ldots,=tN,$$

a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

$$ns>n1>n2>n3>,\ldots,nN>na>nb,\text{ and further}$$

a refractive index difference between mutually adjacent layers among the plurality of layers which compose the first SCH layer and second SCH layer is set to be smaller as going from the active layer to the n-type cladding layer and p-type cladding layer in a relationship of:

$$ns-n1>n1-n2>n2-n3>,\ldots,>nN-nb>nN-na.$$

In order to achieve the above object, according to a seventh aspect of the present invention, there is provided a semiconductor laser according to the fifth aspect, wherein assuming that a refractive index of a plurality of partition layers in the active layer is ns;

that a refractive index and thickness of the plurality of layers in the first SCH layer are $n1, n2, n3, \ldots, nN$ and $t1, t2, t3, \ldots, tN$, respectively, sequentially from a side closer to the active layer; and that a refractive index and thickness of the plurality of layers in the second SCH layer are $n1, n2, n3, \ldots, nN$ and $t1, t2, t3, \ldots, tN$, respectively, sequentially from the side closer to the active layer, a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

$$ns>n1>n2>n3>,\ldots,nN>na>nb,$$

a refractive index difference between mutually adjacent layers among the plurality of layers which compose the first SCH layer and second SCH layer is set to be in a relationship of:

$$ns-n1=n1-n2=n2-n3=,\ldots,=nN-nb\text{ (provided that }nN-nb>nN-na),\text{ and}$$

a relationship of the thicknesses of the layers is set in the following relation so as to be larger as being more remote from the active layer:

$$t1<t2<t3,\ldots,<tN.$$

In order to achieve the above object, according to an eighth aspect of the present invention, there is provided a semiconductor laser according to the fifth aspect, wherein assuming that a refractive index of a plurality of partition layers in the active layer is ns;

that a refractive index and thickness of the plurality of layers in the first SCH layer are $n1, n2, n3, \ldots, nN$ and $t1, t2, t3, \ldots, tN$, respectively, sequentially from a side closer to the active layer; and that a refractive index and thickness of the plurality of layers in the second SCH layer are $n1, n2, n3, \ldots, nN$ and $t1, t2, t3, \ldots, tN$, respectively, sequentially from the side closer to the active layer, a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

$$ns>n1>n2>n3>,\ldots,nN>na>nb,$$

a refractive index difference between mutually adjacent layers among the plurality of layers which compose the first SCH layer and second SCH layer is set to be smaller as going further from the active layer in a relationship of:

$$ns-n1>n1-n2>n2-n3>,\ldots,>nN-nb>nN-na,\text{ and}$$

a relationship of the thicknesses of the layers is set in the following relation so as to be larger as being more remote from the active layer:

$$t1<t2<t3<,\ldots,<tN.$$

In order to achieve the above object, according to a ninth aspect of the present invention, there is provided a semiconductor laser according to the fifth aspect, wherein assuming that a refractive index of a layer having the lowest refractive index among the layers forming the active layer is ns;

that a refractive index and thickness of the plurality of layers in the first SCH layer are n1, n2, n3, ..., nN and t1, t2, t3, ..., tN, respectively, sequentially from a side closer to the active layer; and that a refractive index and thickness of the plurality of layers in the second SCH layer are n1, n2, n3, ..., nN and t1, t2, t3, ..., tN, respectively, sequentially from the side closer to the active layer, a relationship of the thicknesses of the layers is set to be equal to each other in a relationship of:

t1=t2=t3=, ..., =tN, a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

ns>n1>n2>n3>, ..., nN>nb, and also na>nN, and a refractive index difference between mutually adjacent layers among the plurality of layers which compose the first SCH layer and second SCH layer is set to be smaller as going from the active layer to the n-type cladding layer and the p-type cladding layer in a relationship of:

ns−n1>n1−n2>n2−n3>, ..., >n(N−1)−nN.

In order to achieve the above object, according to a tenth aspect of the present invention, there is provided a semiconductor laser according to the fifth aspect, wherein assuming that a refractive index of a layer having the lowest refractive index among the layers forming the active layer is ns;

that a refractive index and thickness of the plurality of layers in the first SCH layer are n1, n2, n3, ..., nN and t1, t2, t3, ..., tN, respectively, sequentially from a side closer to the active layer; and that a refractive index and thickness of the plurality of layers in the second SCH layer are n1, n2, n3, ..., nN and t1, t2, t3, ..., tN, respectively, sequentially from the side closer to the active layer, a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

ns>n1>n2>n3>, ..., nN>nb, and also na>nN, a refractive index difference between mutually adjacent layers among the plurality of layers which compose the first SCH layer and second SCH layer is set to be in a relation of:

ns−n1=n1−n2=n2−n3=, ..., =nN−nb, and relationship of the thicknesses of the layers is set to be larger as being more remote from the active layer in a relation of:

t1<t2<t3<, ..., <tN.

In order to achieve the above object, according to an eleventh aspect of the present invention, there is provided a semiconductor laser according to the fifth aspect, wherein assuming that a refractive index of a layer having the lowest refractive index among the layers forming the active layer is ns;

that a refractive index and thickness of the plurality of layers in the first SCH layer are n1, n2, n3, ..., nN and t1, t2, t3, ..., tN, respectively, sequentially from a side closer to the active layer; and that a refractive index and thickness of the plurality of layers in the second SCH layer are n1, n2, n3, ..., nN and t1, t2, t3, ..., tN, respectively, sequentially from the side closer to the active layer, a great and small relationship of the refractive indexes of the layers is set so as to be smaller as going further from the active layer as shown below, including a relationship in which the refractive index ns of the active layer is highest, and a refractive index na of the n-type cladding layer is higher than a refractive index nb of the p-type cladding layer:

ns>n1>n2>n3>, ..., nN>nb, and also na>nN, a refractive index difference between mutually adjacent layers among the plurality of layers which compose the first SCH layer and second SCH layer is set to be smaller as going further from the active layer in a relationship of:

ns−n1>n1−n2>n2−n3>, ..., >n(N−1)−nN, and a relationship of the thicknesses of the layers is set to be larger as being more remote from the active layer in a relationship of:

t1<t2<t3<, ..., <tN.

In order to achieve the above object, according to a twelfth aspect of the present invention, there is provided a semiconductor laser according to the fourth aspect, wherein the semiconductor laser is formed in a buried heterostructure.

In order to achieve the above object, according to a thirteenth aspect of the present invention, there is provided a semiconductor laser according to the twelfth aspect, wherein part of the n-type cladding layer, the first SCH layer, the active layer, the second SCH layer, and the p-type cladding layer is formed in a mesa shape, and the semiconductor laser further comprises:

a first buried layer (7) made of p-type InP, which is formed with one side thereof in contact with the semiconductor substrate or the n-type cladding layer at both sides of each layer formed in the mesa shape; and a second buried layer (8) made of n-type InP, which is formed with one side thereof in contact with the p-type cladding layer and the other side thereof in contact with the other side of the first buried layer (7) at both sides of each layer formed in the mesa shape.

In order to achieve the above object, according to a fourteenth aspect of the present invention, there is provided a semiconductor laser according to the first aspect, wherein the semiconductor laser is formed in a ridge structure.

In order to achieve the above object, according to a fifteenth aspect of the present invention, there is provided a semiconductor laser according to the fourteenth aspect, wherein when the semiconductor substrate is an n-type, the p-type cladding layer is formed as a ridge structure portion with substantially the center of the outside being raised to the upside, and the semiconductor laser further comprises:

a contact layer (10) formed on a upside of the ridge structure portion in the p-type cladding layer;

an insulating layer (23) having an opening portion above a center of the contact layer and which is formed to cover the p-type cladding layer including the ridge structure portion; and an electrode (11) formed on a top of the insulating layer with a part thereof connected to the contact layer.

In order to achieve the above object, according to a sixteenth aspect of the present invention, there is provided a semiconductor laser according to the first aspect, wherein a bandgap wavelength of InGaAsP which composes the n-type cladding layer is a bandgap wavelength of InP or more and 0.98 µm or less.

In order to achieve the above object, according to a seventeenth aspect of the present invention, there is provided a semiconductor laser according to the sixteenth aspect, wherein a bandgap wavelength of InGaAsP which composes the n-type cladding layer is 0.96 µm or more and 0.98 µm or less.

In order to achieve the above object, according to an eighteenth aspect of the present invention, there is provided a semiconductor laser according to the first aspect, wherein, when the semiconductor substrate is an n-type, the n-type cladding layer is formed beneath the active layer, and the p-type cladding layer is formed above the active layer.

In order to achieve the above object, according to a nineteenth aspect of the present invention, there is provided a semiconductor laser according to the first aspect, wherein, when the semiconductor substrate is a p-type, the n-type cladding layer is formed above the active layer, and the p-type cladding layer is formed beneath the active layer.

According to the semiconductor laser of the invention, the n-type cladding layer (3) is composed of four elements In, Ga, As and P, the bandgap wavelength of the n-type cladding layer (3) is 0.96 to 0.98 µm, and the width of the active layer (5) is 7 to 14 µm. Accordingly, wile maintaining the oscillation fundamental lateral mode, the laser light of high output can be coupled with an external single mode optical fiber at high coupling efficiency.

Further, according to the semiconductor laser of the invention, the lens, taper light waveguide, and other spot size converters as used in the prior art are not required, so that the manufacturing process is simplified, the device length is shortened, and the device cost can be lowered.

BRIEF DESCRIPTION OF DRAWINGS

FIG. 11 is a diagram showing supply current and output characteristic of the semiconductor laser shown in FIG. 10 according to the another embodiment of the invention.

FIG. 12 is a view for explaining a semiconductor laser of a ridge structure according to another embodiment of the invention.

FIG. 15 is a diagram showing an example and another example of optical coupling between a semiconductor laser and an external single mode optical fiber according to the invention.

FIG. 16 is a diagram showing refractive index characteristic of each layer of a semiconductor laser according to another embodiment of the invention.

BEST MODE FOR CARRYING OUT THE INVENTION

A semiconductor laser according to embodiments of the invention will be described below with reference to the accompanying drawings.

Figure 1:
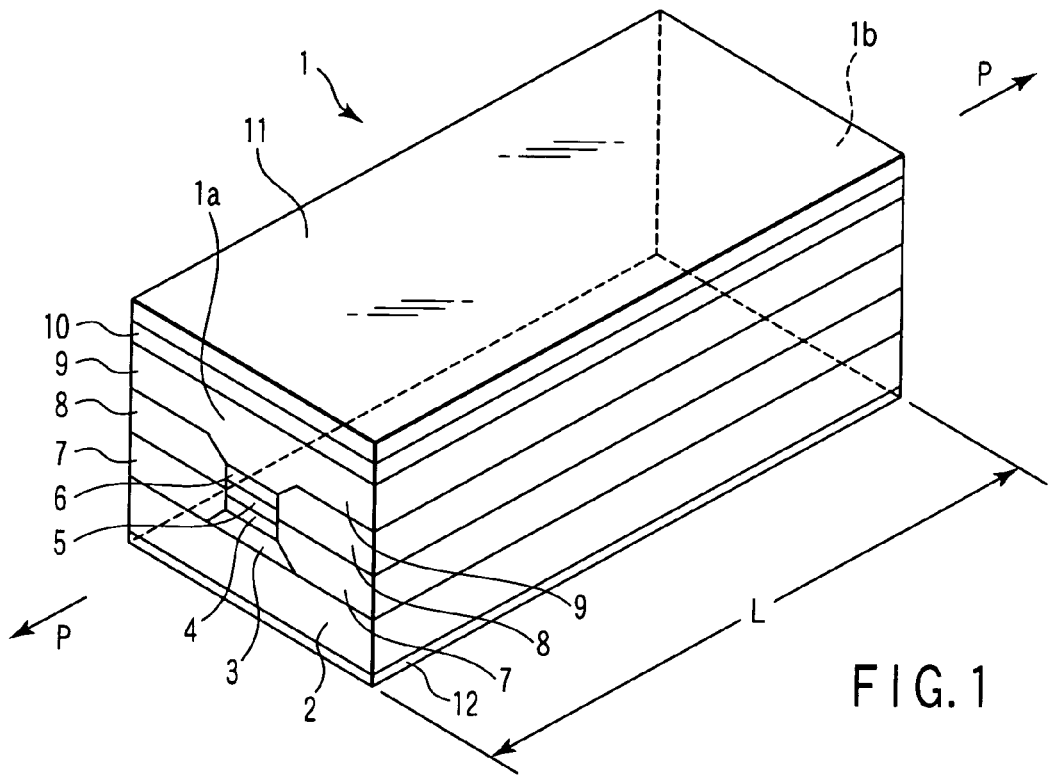
FIG. 1 is a perspective view showing a schematic configuration of a semiconductor laser according to a first embodiment of the invention.
Figure 2:
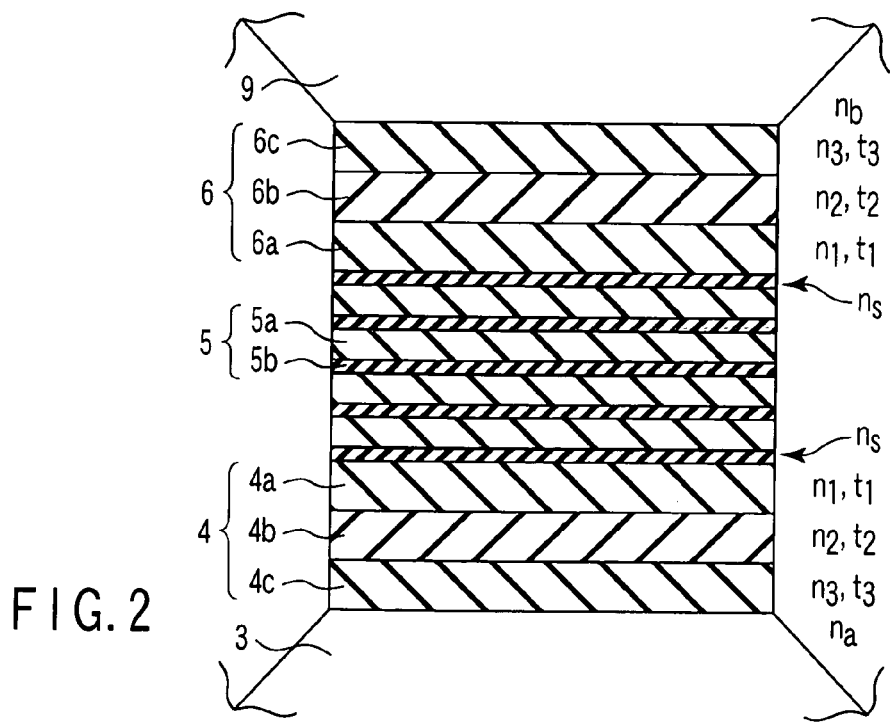
FIG. 2 is a sectional view of essential parts of the semiconductor laser according to the first embodiment of the invention.

FIG. 1 is a perspective view of an entire configuration of a semiconductor laser according to a first embodiment of the invention, and FIG. 2 is a partially enlarged sectional view of the semiconductor laser according to the first embodiment of the invention.

As shown in FIG. 1, a semiconductor laser 1 according to the first embodiment of the invention comprises an n-type cladding layer 3 made of n-type InGaAsP, a first separate confinement heterostructure (SCH) layer 4 made of InGaAsP, an active layer 5 made of InGaAsP, and a second SCH layer 6 made of InGaAsP which are sequentially laminated on a semiconductor substrate 2 made of n-type InP.

In FIG. 1, the n-type cladding layer 3, the first SCH layer 4, the active layer 5, and the second SCH layer 6 are formed in a mesa shape, and at both sides of the mesa shape, a lower buried layer 7 made of p-type InP and an upper buried layer 8 made of n-type InP are formed.

Further, a p-type cladding layer 9 made of p-type InP is formed on the upper side of the second SCH layer 6 and on the top face of the upper buried layer 8. On the top face of the p-type cladding layer 9, a p-type contact layer 10 is formed. Further, on the top face of the p-type cladding layer 10, a p electrode 11 is provided. In addition, an n electrode 12 is provided on the lower side of the semiconductor substrate 2.

In the semiconductor laser according to the first embodiment of the invention, as shown in FIG. 2, the active layer 5 employs a four-layer multiquantum well (MQW) structure in which four layers of well layer 5a, and five layers of partition layer 5b positioned at both sides of these well layers 5a are laminated.

The first SCH layer 4 positioned at the lower side of the active layer 5 having such a four-layer MQW structure is composed of multiple layers 4a, 4b, 4c, ..., 4N, and similarly the second SCH layer 6 positioned at the lower side of the active layer 5 is composed of multiple layers 6a, 6b, 6c, ..., 6N.

As shown in FIG. 2, a refractive index of the partition layer 5b in the active layer 5 is supposed to be ns, a refractive index of the n-type cladding layer 3 to be na, and a refractive index of the p-type cladding layer 9 to be nb.

A refractive index and thickness of the layers 4a, 4b, 4c, ..., 4N for composing the first SCH layer 4 are supposed to be n1, n2, n3, ..., nN and t1, t2, t3, ..., tN, respectively, and similarly a refractive index and thickness of the layers 6a, 6b, 6c, ..., 6N for composing the second SCH layer 6 are supposed to be n1, n2, n3, ..., nN and t1, t2, t3, ..., tN, respectively.

The great and small relationship of the refractive indexes is set so as to be smaller as going further from the active layer 5 as shown in the inequality below, and the refractive index na of the n-type cladding layer 3 made of InGaAsP is set higher than the refractive index nb of the p-type cladding layer 9 made of InP as shown in the inequality below.

$$ns > n1 > n2 > n3 >, \ldots, nN > na > nb$$

Figure 3:
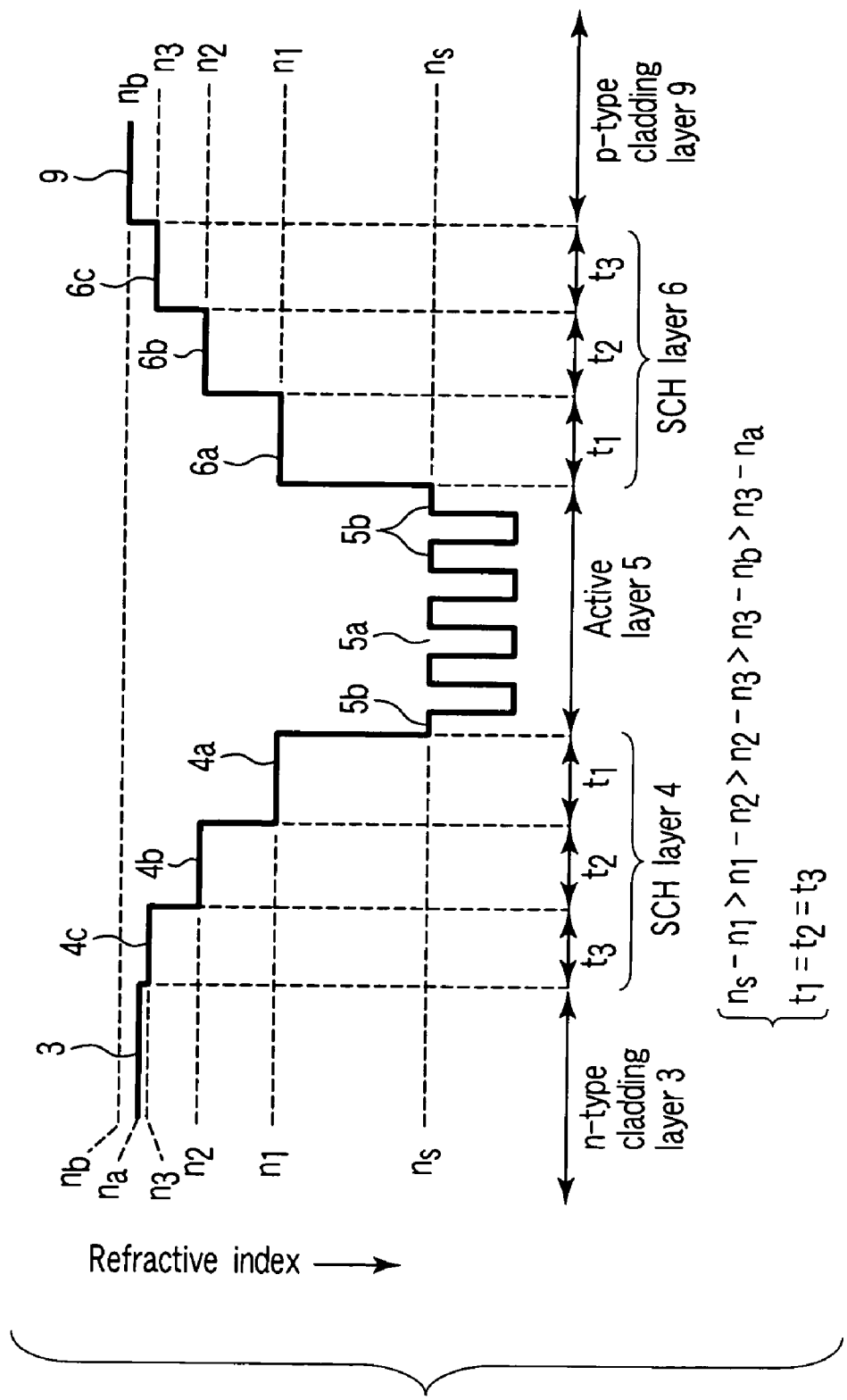
FIG. 3 is a diagram showing the refractive index characteristic of each layer of the semiconductor laser according to the first embodiment of the invention.

Further, in the semiconductor laser 1, as shown in FIG. 3, a refractive index difference between mutually adjacent layers for composing the first SCH layer 4 and second SCH layer 6 is set to be smaller as going from the active layer 5 to the cladding layer 3, 9.

That is, the refractive index difference between mutually adjacent layers for composing the first SCH layer 4 and second SCH layer 6 is set as shown in the inequality below.

$$ns - n1 > n1 - n2 > n2 - n3 >, \ldots, > nN - nb > nN - na$$

The thicknesses t1, t2, t3, ..., tN of the layers for composing the first SCH layer 4 and second SCH layer 6 are set equally.

That is, the thicknesses of the layers are set as follows.

$$t1 = t2 = t3 =, \ldots, tN$$

In the semiconductor laser 1 having such a configuration, when a direct-current voltage is applied between the p electrode 11 and the n electrode 12, light P is generated in the active layer 5, and the light P is emitted outside from the end faces 1a, 1b of the semiconductor laser 1 shown in FIG. 1.

Herein, in the semiconductor laser 1, the width of active layer 5 capable of obtaining sufficient coupling efficiency with the single mode optical fiber while suppressing generation of the lateral harmonic mode will be explained.

That is, in the semiconductor laser 1, as mentioned above, when the light P generated in the active layer 5 is emitted outside from the end faces 1a, 1b of the semiconductor laser 1, the exit light is emitted outside in a predetermined spot diameter.

The spot diameter is a diameter of a portion with maximum light intensity $1/e^2$ (e the being the base of a natural logarithm) in light intensity distribution at an end of the active layer 5, of the light emitted from the end.

Figure 4:
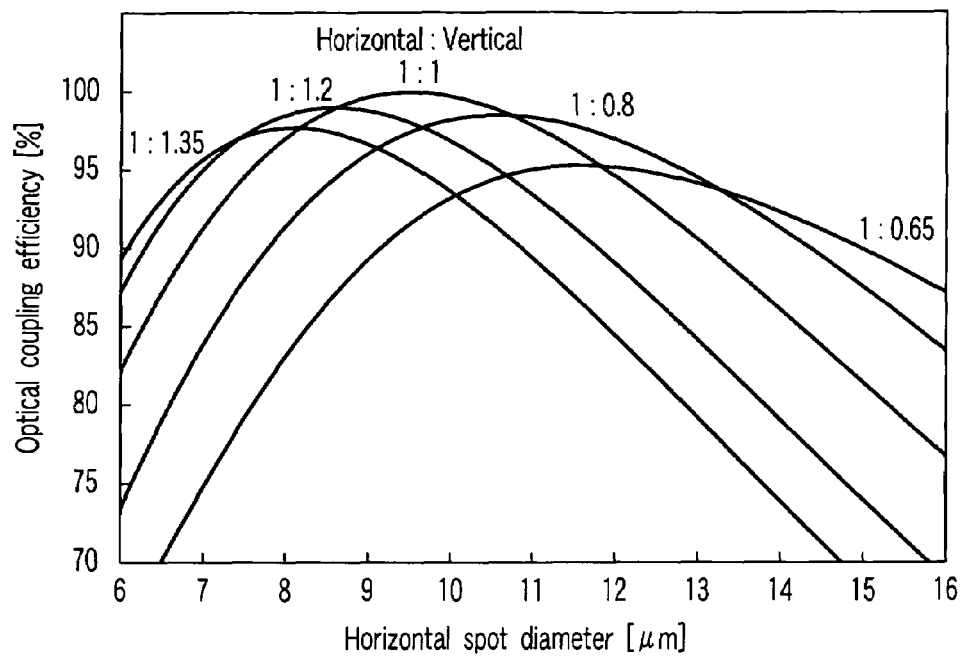
FIG. 4 is a diagram showing the relation between the horizontal spot diameter of exit light and optical coupling efficiency with a single mode optical fiber, in terms of a flatness rate of an optical spot of the semiconductor laser according to the first embodiment of the invention.

FIG. 4 is a diagram showing the relation between a horizontal spot diameter of the exit light and optical coupling efficiency with the single mode optical fiber, in terms of a flatness rate of a light spot in the semiconductor laser 1 of the invention.

The flatness rate of the light spot is a ratio of the spot diameter in the horizontal direction: vertical direction, and ratios 1:1.35, 1:1.2, 1:1, 1:0.8, and 1:0.65 are shown.

The semiconductor laser 1 oscillates in the fundamental lateral mode, and the light emitted from the end faces 1a, 1b of the semiconductor laser 1 is optically coupled, without lens, for example, with the single mode optical fiber disposed closely to either one of the end faces 1a, 1b of the semiconductor laser 1 as described below.

As known from FIG. 4, in the semiconductor laser 1 of the invention, the required horizontal spot diameter is 7 to 14 μm in order to obtain high optical coupling efficiency of about 75% or more at any flatness rate of the light spot.

Figure 5:
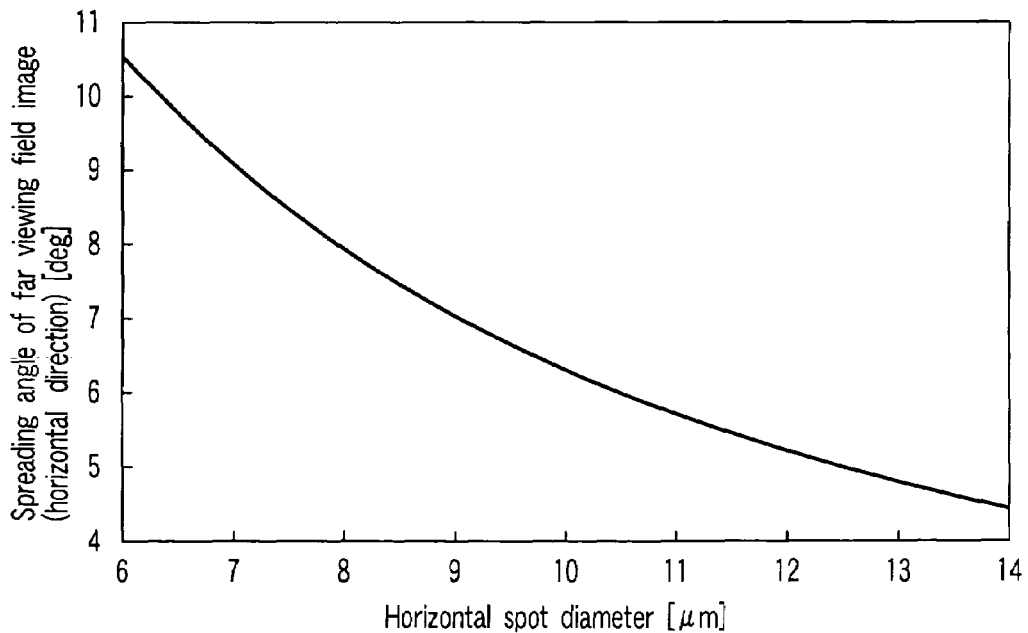
FIG. 5 is a diagram showing the relation between the horizontal spot diameter and a spreading angle of a far viewing field image of laser exit light of the semiconductor laser according to the first embodiment of the invention.

FIG. 5 is a diagram showing the relation between the horizontal spot diameter and a spreading angle of a far viewing field image of a laser exit light in semiconductor laser 1 of the invention.

Figure 6:
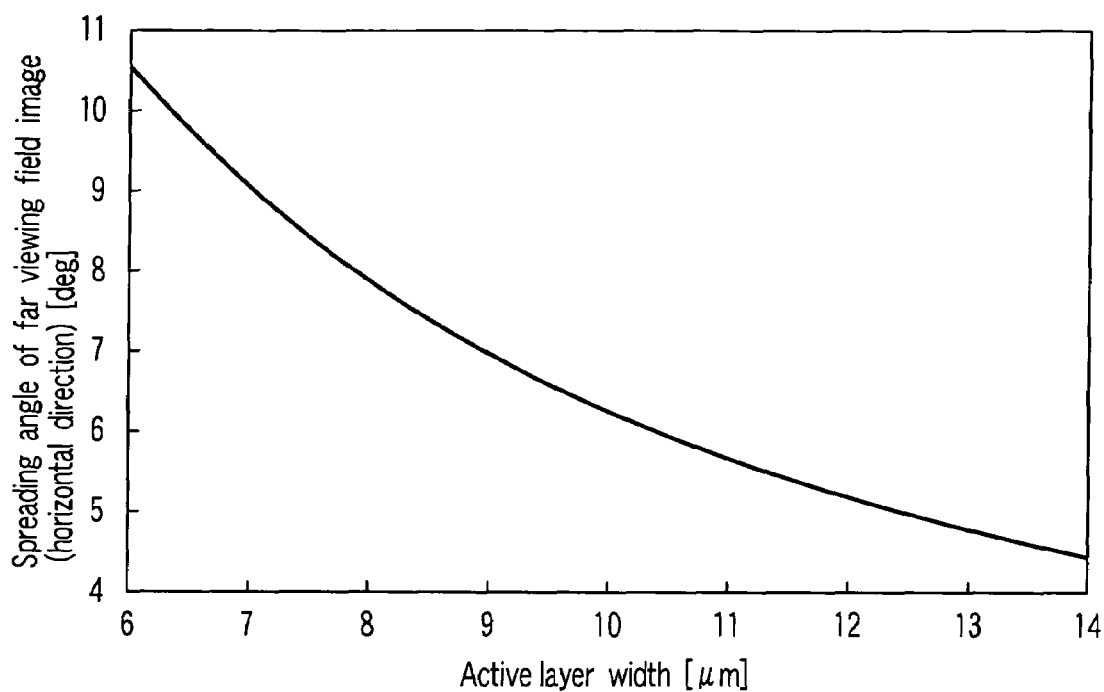
FIG. 6 is a diagram showing the relation between the width of an active layer and the spreading angle of the far viewing field image of the laser exit light of the semiconductor laser according to the first embodiment of the invention.

FIG. 6 is a diagram showing the relation between the width of the active layer 5 and the spreading angle of the far viewing field image of the laser exit light in semiconductor laser 1 of the invention.

As is clear from comparison between FIG. 5 and FIG. 6, in the semiconductor laser 1 of the invention, the width of the active layer 5 and the horizontal spot diameter when the same spreading angle is obtained are substantially equal to each other.

Therefore, it may be assumed that the width of the active layer 5=spot diameter in the semiconductor laser 1 of the embodiment.

Accordingly, in the semiconductor laser 1 of the embodiment, it is sufficient when the width of the active layer 5 is 7 to 14 μm in order to obtain a high optical coupling efficiency of about 75% or more in optical coupling with the single mode optical fiber.

In this kind of semiconductor laser 1, merely by expanding the active lager width, the lateral harmonic mode is generated in the oscillation mode of the laser, so that not only the laser characteristic is impaired, but also the optical coupling efficiency with the fiber is lowered.

In the semiconductor laser 1 of the embodiment, as mentioned above, the n-side cladding layer is composed of InGaAsP, whereby the same effects are obtained as when decreasing the equivalent refractive index of an optical waveguide for guiding the light inside the semiconductor laser 1. Consequently, a semiconductor laser of wide active layer width while suppressing generation of the higher lateral mode can be realized.

As stated above, the present inventors or the like previously disclosed, in U.S. patent application Ser. No. 10/692,125 and European patent application No. 03 025 058.3, a semiconductor light emitting device applicable to a semiconductor laser, which is capable of obtaining a light output of higher power in a simple configuration, and expanding the maximum width of an active layer that can suppress a lateral harmonic mode because an n-type cladding layer is made of InGaAsP having larger refractive index than a p-type cladding layer made of InP.

These prior applications, however, do not suppose that a semiconductor laser and a single mode optical fiber are optically coupled without using a lens in order to transmit an optical signal from the semiconductor laser as a light source as considered in the present invention, and thus, the expandable width of the active layer is 3.5 μm or more, and 4.0 μm at maximum.

Therefore, if the semiconductor light emitting device disclosed in these prior applications is applied in a semiconductor laser as a light source used in an optical communication system, the expandable width of an active layer is 3.5 μm to 4.0 μm at most. Consequently, it is not realistic from the viewpoint of coupling loss to couple the semiconductor laser and a single mode optical fiber optically without using a lens.

In these prior applications, in the semiconductor laser 1 of the invention, nothing is analyzed or discussed about the required width of the active layer 5 of 7 to 14 μm in order to obtain high optical coupling efficiency of about 75% or more in optical coupling with the single mode optical fiber.

Figure 7:
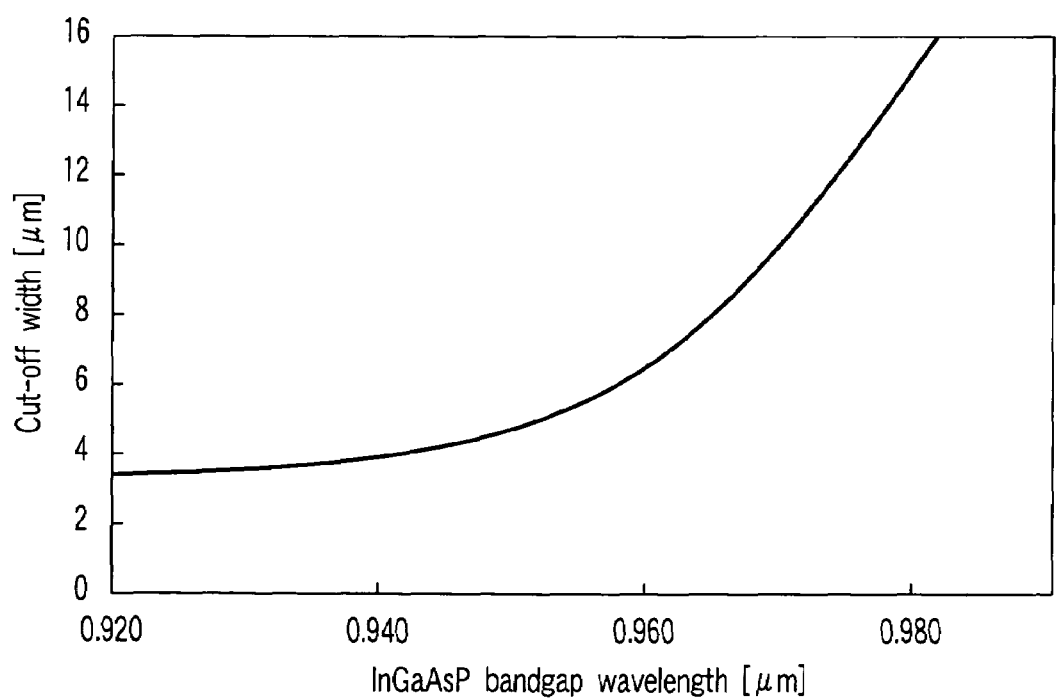
FIG. 7 shows an example of relation diagram of the maximum active layer width (=cut-off width) capable of suppressing a lateral harmonic mode, in relation to the bandgap wavelength of InGaAsP for use in an n-type cladding layer in the same active layer structure of the semiconductor laser according to the first embodiment of the invention.

FIG. 7 shows an example of the relation of the maximum active layer width (=cut-off width) capable of suppressing the lateral harmonic mode, in relation to bandgap wavelength of InGaAsP used in the n-type cladding layer in the same active layer structure of the semiconductor laser 1 of the invention.

According to this relation, as in the case of a semiconductor laser using an ordinary InP cladding layer with bandgap wavelength of 0.925 μm in the n-side cladding layer, the cut-off width is about 3.5 μm in the semiconductor laser using InGaAsP with a bandgap wavelength of 0.925 μm in the n-side cladding layer.

By contrast, when the bandgap wavelength of InGaAsP used in the n-side cladding layer is 0.96 μm, the cut-off width is about 7 μm, and further when the bandgap wavelength is 0.98 μm, the cut-off width can be expanded up to about 14 μm.

Referring to FIG. 3, the refractive index of each layer of the semiconductor laser 1 in this embodiment will be explained.

As shown in the refractive index characteristic in FIG. 3, in the semiconductor laser 1 of the embodiment, the refractive index difference of mutually adjacent layers among the layers 4a, 4b, 4c, 6a, 6b, 6c for composing the first and second SCH layers 4, 6 is set to be smaller as going from the active layer 5 to the cladding layers 3, 9.

As a result, in the semiconductor laser 1 of the embodiment, the refractive index drops suddenly in a region with high refractive index in the neighboring region of the active layer 5 in the first and second SCH layers 4, 6, while the refractive index declines slowly in a region with low refractive index in the neighboring region of both the cladding layers 3, 9.

Hence, the degree of concentration of light is lessened in the optical waveguide for guiding the light inside the semiconductor laser 1 of the embodiment, that is, the light confinement coefficient can be lowered, and the internal loss declines.

Figure 8:
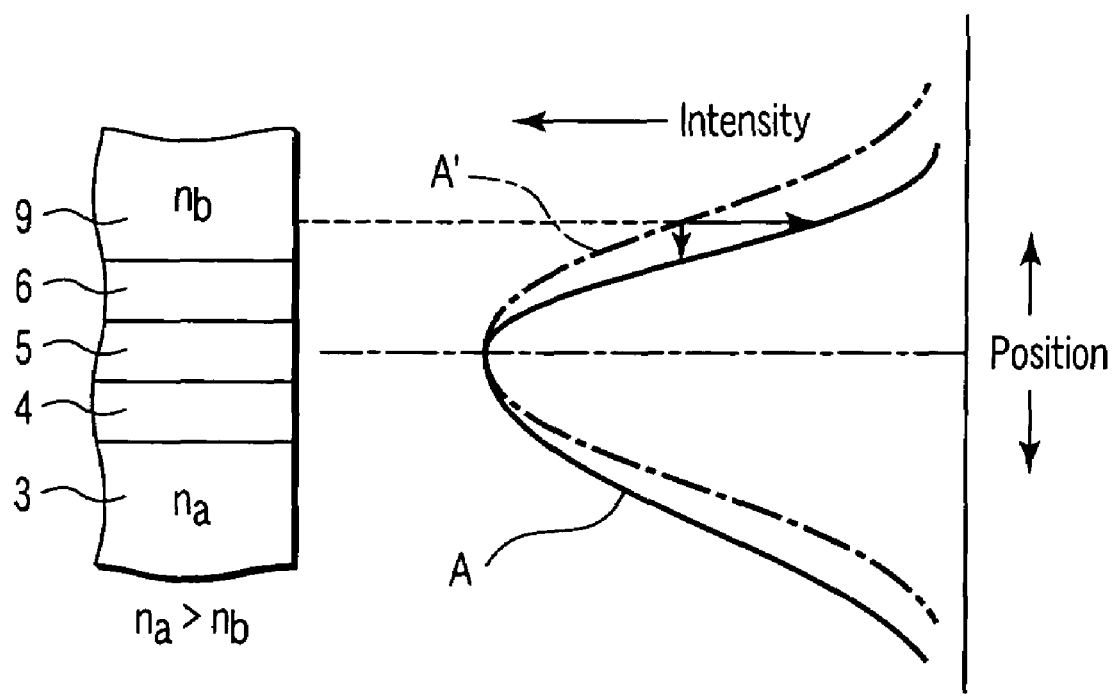
FIG. 8 is a diagram showing distribution characteristic of light of the semiconductor laser according to the first embodiment of the invention.

In the semiconductor laser 1 of the embodiment, the refractive index na of the n-type cladding layer 3 made of InGaAsP is higher than the refractive index nb of the p-type cladding layer 9 made of InP. Therefore, as shown in FIG. 8, the light distribution is biased to the n-type cladding layer 3 side as indicated by characteristic curve A, as compared with symmetrical characteristic curve A' of the same refractive index in both the cladding layers 3, 9.

Accordingly, in the semiconductor laser 1 of the embodiment, it is possible to suppress increase of optical loss due to light absorption between valence bands in the p-type cladding layer 9 by lowering the light confinement coefficient in the active layer 5 and first and second SCH layers 4, 6, so that laser light of high output can be obtained.

Also in the semiconductor laser 1 of the embodiment, the refractive index difference of active layer 5 and n-type cladding layer 3 is smaller than in the prior art, and thus, the maximum active layer width capable of suppressing the lateral harmonic mode can be also expanded, which is further advantageous for higher output of the laser.

Specifically, in the semiconductor laser 1 of the embodiment, the bandgap wavelength of the n-type cladding layer is set in a range of 0.96 to 0.98 μm, whereby the maximum active layer width capable of suppressing the lateral harmonic mode can be expanded to about 7 to 14 μm.

Consequently, in the semiconductor laser 1 of the embodiment, not only the drop of the optical output due to increase of the device resistance value can be prevented, but also the light spot size can be expanded, and therefore, it is possible to couple to the single mode optical fiber, for example, without a lens as described later.

In the semiconductor laser 1 of the embodiment, moreover, it is not required to increase the thickness of the p-type cladding layer 9, and there is no risk of drop of the optical output due to increase of the device resistance value.

Herein, as a method of decreasing the light confinement coefficient in the active layer 5 and first and second SCH layers 4, 6, the refractive index difference between mutually adjacent layers for composing the first and second SCH layers 4, 6 is set to be smaller as going away from the active layer 5, and each layer is formed in a uniform thickness.

Figure 9:
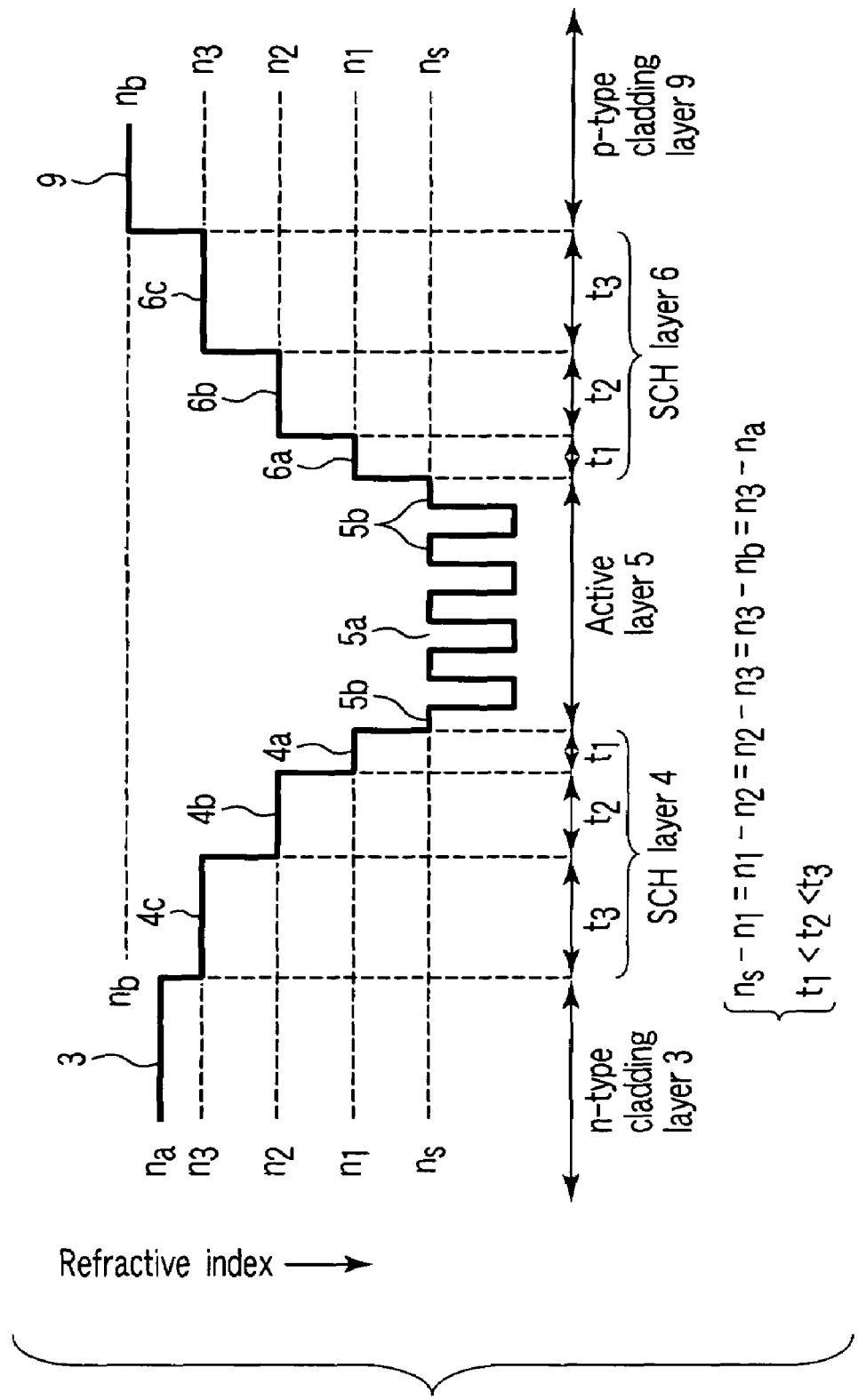
FIG. 9 is a diagram showing refractive index characteristic of each layer of a semiconductor laser according to another embodiment of the invention.

Not limited to this method, in a semiconductor laser 1 of another embodiment, as shown in FIG. 9, by equalizing the refractive index difference between mutually adjacent layers for composing the first and second SCH layers 4, 6, and setting the thickness of the layers to be larger as being more remote from the active layer 5, the relationship may be set as shown in the two formulas below:

$$ns-n1 = n1-n2 = n2-n3 =, \ldots, = nN-nb \text{ (provided that } nN-nb > Nn-na\text{), and}$$

$$t1 < t2 < t3, \ldots, < tN.$$

Figure 10:
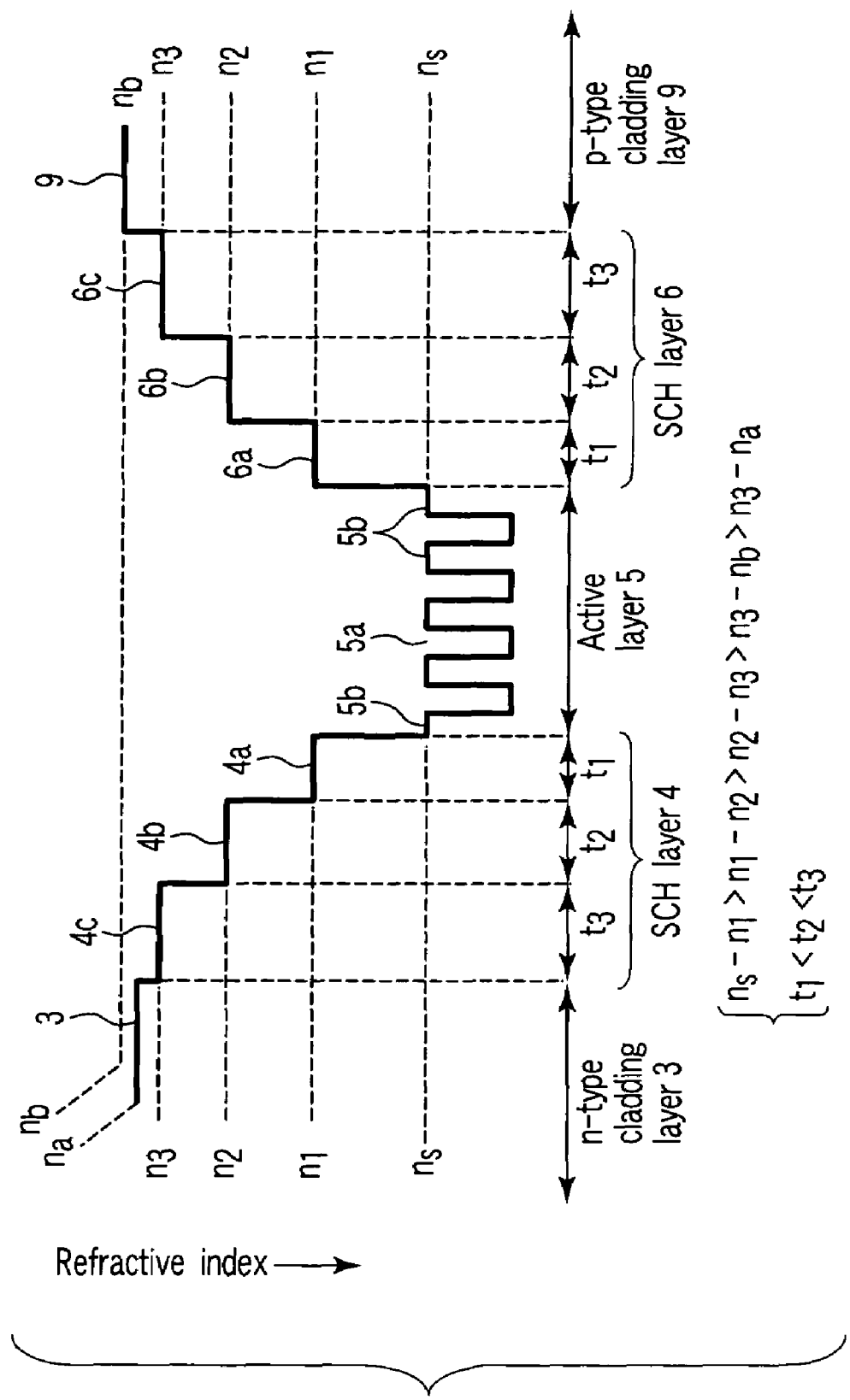
FIG. 10 is a diagram showing refractive index characteristic of each layer of a semiconductor laser according to another embodiment of the invention.

In a semiconductor laser 1 of a further embodiment, as shown in FIG. 10, the refractive index difference between mutually adjacent layers for composing the first and second SCH layers 4, 6 may be set to be smaller as going away from the active layer 5, and the thickness of the layers to be larger as being more remote from the active layer 5, as shown in the two formulas of inequality below;

$$ns-n1 > n1-n2 > n2-n3 >, \ldots, > nN-nb > nN-na, \text{ and}$$

$$t1 < t2 < t3, \ldots, < tN.$$

Even in the case where the refractive index characteristic of the layers of the semiconductor laser 1 is set as shown above in FIGS. 9 and 10, the refractive index drops suddenly in a region with high refractive index in the neighboring region of the active layer 5 in the first and second SCH layers 4, 6, while the refractive index declines slowly in a region with low refractive index in the neighboring region of both the cladding layers 3, 9.

Therefore, the degree of concentration of light is lessened in the optical waveguide for guiding the light inside the semiconductor laser 1 in these other embodiments, that is, the light confinement coefficient can be set lower, so that the internal loss declines.

Even in the case of the semiconductor laser 1 of any embodiment, the refractive index na of the n-type cladding layer 3 made of InGaAsP is higher than the refractive index nb of the p-type cladding layer 9 made of InP. Therefore, as shown in FIG. 8, the light distribution is biased to the n-type cladding layer 3 side.

Even in the case of the semiconductor laser 1 of any embodiment, by lowering the light confinement coefficient in the active layer 5 and first and second SCH layers 4, 6, it is effective to suppress increase of optical loss due to inter valance band absorption (IVBA) in the p-type cladding layer 9, so that laser light of high output can be obtained.

Concerning the refractive index and thickness of the parts of a semiconductor laser 1 in another embodiment shown in FIG. 10, specific numerical value examples and their characteristics are shown below.

In the semiconductor laser 1 of the embodiment, the resonator length L is set at L=3 mm in the configuration shown in FIG. 1.

One of the end faces 1a, 1b in the semiconductor laser 1 is a high reflection (HR) film, and the other is a low reflection (LF) film.

The width of the active layer 5 in the semiconductor laser 1 is set at 9.0 μm.

In this semiconductor laser 1, the refractive indices ns, n1, n2, n3, na, nb of the layers 4a, 4b, 4c, 6a, 6b, 6c are set as follows as bandgap wavelengths.

ns=1.2 μm
n1=1.15 μm
n2=1.08 μm
n3=0.99 μm
na=0.97 μm
nb=0.925 μm

Since the p-type cladding layer 9 is composed of InP of which composition is determined, its bandgap wavelength nb is uniquely 0.925 μm.

The thicknesses t1, t2, t3 of these layers 4a, 4b, 4c, 6a, 6b, 6c of the semiconductor laser 1 are set as follows.

t1=3.0 nm
t2=8.0 nm
t3=25 nm

The thickness of the n-type cladding layer 3 is about 7.5 μm, but it is difficult with general manufacturing technology to form in this thickness by matching with the grating intervals of four-element composition of InGaAsP.

In particular, when the bandgap wavelength na of the n-type cladding layer 3 is 0.97 μm, the rate of Ga and As is very small as compared with In and P, and thus, it is further difficult to form in this thickness.

In the invention, therefore, by feeding diluting materials and controlling the flow rate of each gas and growth speed, it is possible to realize the n-type cladding layer 3 with a bandgap wavelength na of 0.97 μm formed in a sufficient thickness of about 7.5 μm.

An example of its manufacturing process will be explained below.

First, on a semiconductor substrate 2 made of n-type InP with impurity concentration of 1 to $2 \times 10^{18}/cm^3$, an n-type cladding layer 3 made of InGaAsP of bandgap wavelength of 0.97 μm with impurity concentration of 1 to $2 \times 10^{18}/cm^3$ is formed in a film thickness of 0.75 μm by a metal organic vapor phase epitaxial growth (MOVPE) method.

Next, nondoped InGaAsP layers of bandgap wavelengths of 0.99 μm, 1.08 μm and 1.15 μm are laminated in thicknesses of 25 nm, 8 nm and 3 nm, respectively, and an SCH layer 4 is formed.

On the first SCH layer 4, a well layer 5a made of InGaAsP and a partition layer 5b made of InGaAsP are grown alternately, and an active layer 5 in a multi-quantum well structure of four well layers is formed.

On the active layer 5, nondoped InGaAsP layers of bandgap wavelengths of 1.15 μm, 1.08 μm and 0.99 μm are laminated in thicknesses of 3 nm, 8 nm and 25 nm, respectively, and a second SCH layer 6 is formed.

On the second SCH layer 6, a lower layer of a p-type cladding layer 9 made of InP is formed in a thickness of 0.5 μm at impurity concentration of 5 to $7 \times 10^{17}/cm^3$.

Thereafter, an $SiN_x$ film is deposited on the entire surface by about tens of nm by means of a plasma CVD method or the like, and formed in stripes of about 10 μm in width in a photolithography process, and using the obtained film as an etching mask, it is immersed in an etching solution of mixed solution of hydrochloric acid, hydrogen peroxide water, and water, and a mesa shape is formed. As a result, the width of the portion of the active layer 5 is about 9 μm.

Successively, by using the $SiN_x$ film as a growth inhibition mask, a lower buried layer 7 made of p-type InP and an upper buried layer 8 made of n-type InP are laminated by the MOVPE method, both sides of the mesa are buried, and then, the $SiN_x$ film is removed.

On the entire surface, the upper layer of the p-type cladding layer 9 made of InP with an impurity concentration of 5 to $7 \times 10^{17}/cm^3$ is formed in 2.5 μm, and a p-type contact layer 10 made of InGaAsP with an impurity concentration of about $5 \times 10^{18}/cm^3$ is formed to 0.3 μm.

Further, a p electrode 11 is formed on the top face of the p-type contact layer 10, and an n electrode 12 is formed on the downside of the semiconductor substrate 2, and thereafter, by cutting out in a length of 3 mm, an LR film 21 is applied to the front end face and an HR film 22 is applied to the rear end face, and thereby a laser structure is formed.

FIG. 11 is a diagram showing the current-output characteristic of the semiconductor laser 1 having such a configuration.

In FIG. 11, characteristic curve F represents the characteristic of the semiconductor laser in the numerical value example above, and characteristic curve F' shows the fiber output characteristic produced by optical coupling with the single mode optical fiber, for example, without a lens.

According to the semiconductor laser of this example, favorable characteristic that the coupling efficiency with the single mode optical fiber is about 80% is obtained.

The light confinement coefficient in the p-type cladding layer 9 of the semiconductor laser is 17%, which is substantially lowered as compared with the confinement coefficient 42% of the conventional structure.

The value of internal loss estimated from the actually manufactured semiconductor laser is 5 to 6 $cm^{-1}$ in the conventional structure, and is improved to 3.0 $cm^{-1}$ or less in this semiconductor laser.

Although the semiconductor laser is of a buried structure, the invention can be similarly applied to the semiconductor laser of a ridge structure shown in FIG. 12.

In FIG. 12, an insulating layer 23 made of $SiO_2$ is formed on the p-type cladding layer 9 and p-type contact layer 10.

Also in the case of the semiconductor laser of such a ridge structure, the n-type cladding layer 3 made of InGaAsP with higher refractive index than that of the p-type cladding layer 9 made of InP is used. Accordingly, as in the example above, the light distribution can be biased to the n-type cladding layer 3 side, and the same laser light of high output is obtained as explained above.

Figure 13:
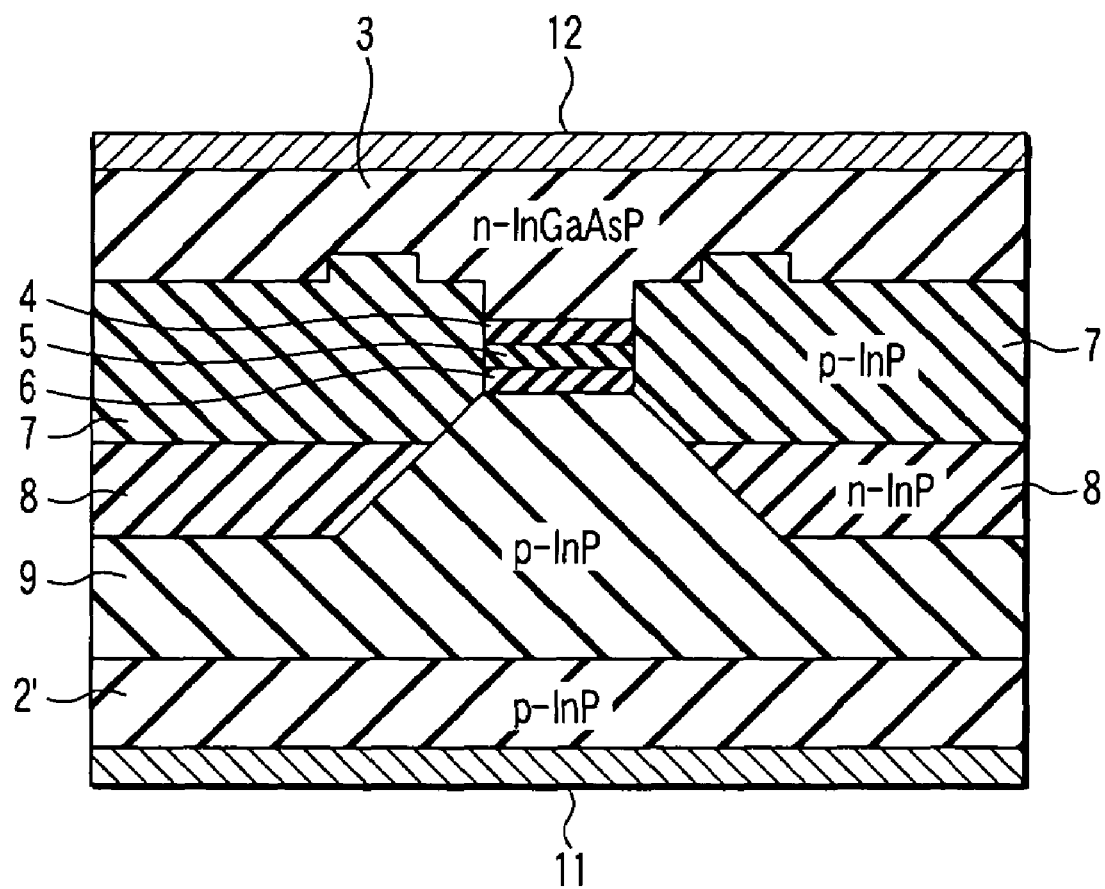
FIG. 13 is a view showing an example of configuration on a p-type substrate as a semiconductor laser according to another embodiment of the invention.

In the semiconductor laser described above, each layer is formed on the n-type semiconductor substrate 2. As shown in FIG. 13, however, even in the semiconductor laser in which each layer is formed on a p-type semiconductor substrate 2', the same effects as above can be obtained by composing the n-type cladding layer 3 by using InGaAsP with a higher refractive index than that of the p-type cladding layer 9 made of InP.

Figure 14:
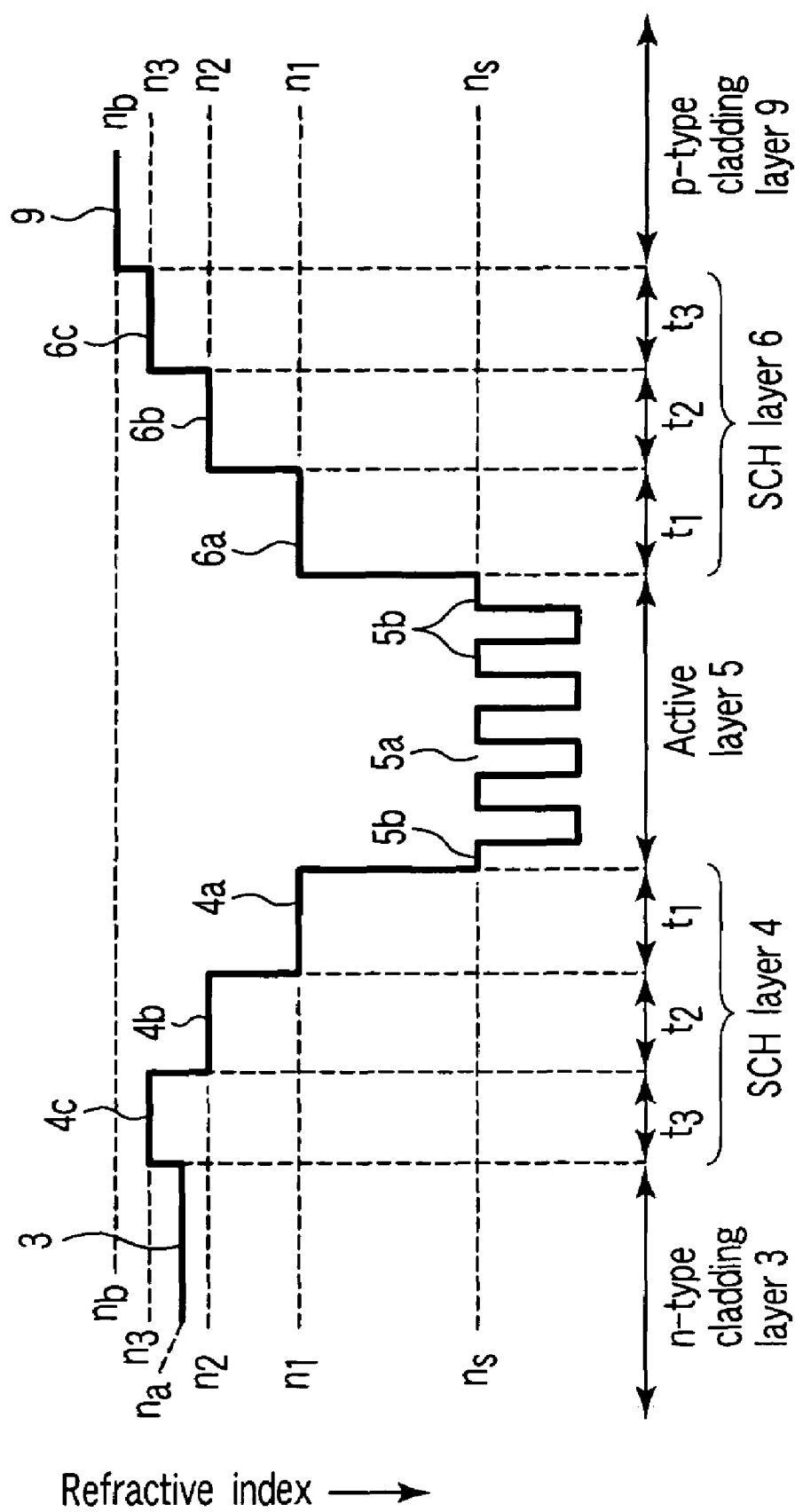
FIG. 14 is a diagram showing refractive index characteristic of each layer of a semiconductor laser according to another embodiment of the invention.
Figure 17:
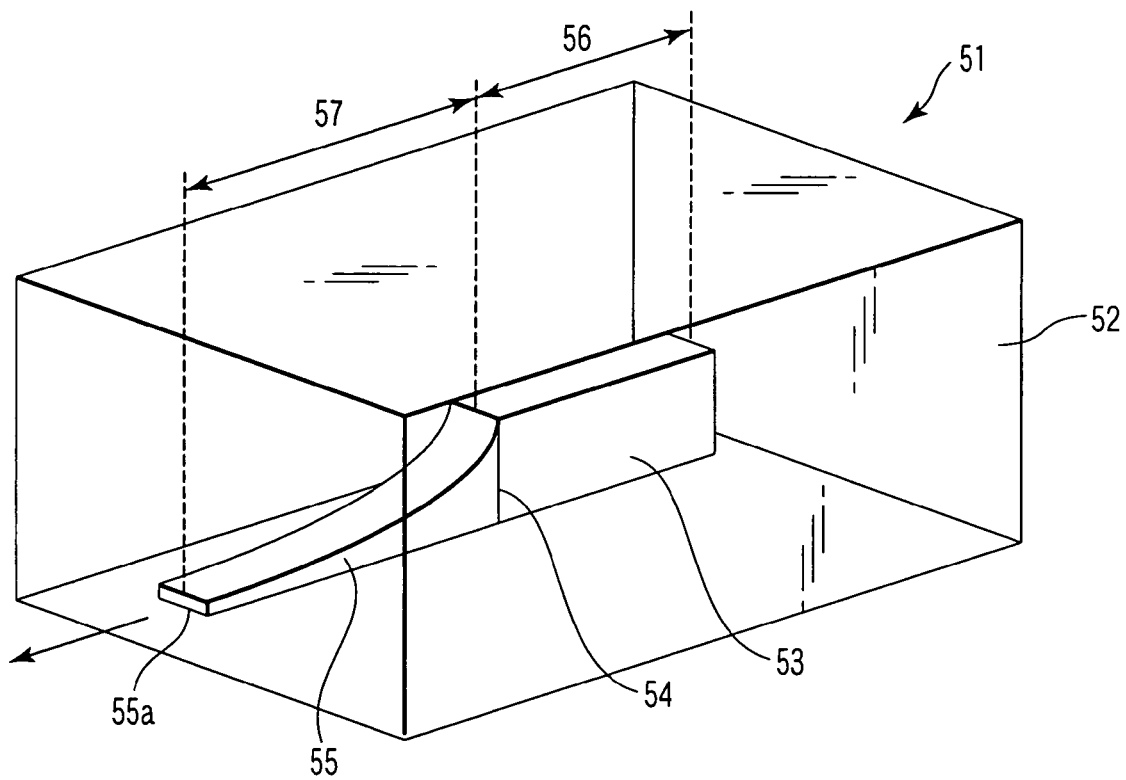
FIG. 17 is a perspective view of a conventional semiconductor optical device disclosed in patent document 1.

In the foregoing semiconductor lasers, the bandgap wavelength of the outermost layer 4c of the first SCH layer 4 is set to be longer than the bandgap wavelength of the n-type cladding layer 3 made of InGaAsP. As shown in FIG. 14, however, the bandgap wavelength of the outermost layer 4c (4N) of first SCH layer 4 may be set to be shorter than the bandgap wavelength of the n-type cladding layer 3 made of InGaAsP.

That is, in the semiconductor laser 1 of another embodiment in FIG. 14, the refractive index nN of the outermost layer 4N of the first SCH layer 4 is set to be lower than the refractive index na of the n-type cladding layer 32 made of InGaAsP (na>nN) as shown in FIG. 14.

Also in the semiconductor laser 1 having the layers formed thereon in such a manner, the same effects as the semiconductor laser 1 in the foregoing embodiments can be obtained by composing the n-type cladding layer 3 by using InGaAsP with a higher refractive index than that of the n-type cladding layer 9 made of InP.

In the semiconductor laser 1 of the other embodiment in FIG. 14, since the refractive index nN of the outermost layer 4N of the first SCH layer 4 is set to be lower than the refractive index na of the n-type cladding layer 3 made of InGaAsP, overflow of injected carriers (holes) can be advantageously prevented.

Incidentally, in the semiconductor laser 1 of the other embodiment in FIG. 14, the great and small relationship of the refractive indexes of the layers is set to be smaller as going away from the active layer as shown below, as shown in FIG. 14, including the refractive index ns of a layer having the lowest refractive index among plural layers for composing the active layer 5 is highest, and the refractive index na of the n-type cladding layer 3 is higher than the refractive index nb of the p-type cladding layer 9:

$$ns > n1 > n2 > n3 >, \ldots, > nN > nb \text{ and}$$

$$na > nN.$$

In addition, in the semiconductor laser 1 of the other embodiment in FIG. 14, as mentioned above, the refractive index nN of the outermost layer 4N of the first SCH layer 4 is set to be lower than the refractive index na of the n-type cladding layer 3 made of InGaAsP (na>nN), and also the relationship is set as follows:

$$ns - n1 > n1 - n2 > n2 - n3 >, \ldots, n(N-1) - nN$$

so that the refractive index difference between mutually adjacent layers among the plural layers for composing the first SCH layer 4 and second SCH layer 6 is set to be smaller as going from the active layer 5 to both the cladding layers 3, 9.

Further, in order that the thicknesses of the layers are equal to each other, the relationship of:

$$t1 = t2 = t3 =, \ldots, tN$$

is established.

This is applied as a partially modified form of the refractive index characteristic (ns−n1>n1−n2>2n−n3>, . . . , >nN−nb>nN−na) of the semiconductor laser 1 in the first embodiment shown in FIG. 3.

Therefore, the configuration of the semiconductor laser 1 of the other embodiment in FIG. 14 in which the refractive index nN of the outermost layer 4N of the first SCH layer 4 is set to be lower than the refractive index na of the n-type cladding layer 3 made of InGaAsP can be applied as a partially modified form of the refractive index characteristic (ns−n1=n1−n2=n2−n3=, . . . , =nN=nb) of the semiconductor laser 1 in the other embodiment shown in FIG. 9, being set so that the refractive index difference between mutually adjacent layers among the plural layers for composing the first SCH layer 4 and second SCH layer 6 may be the same (ns−n1=n1−n2=n2−n3=, . . . , =nN−nb, provided that nN−nb>nN−na), and being set so that the thicknesses of the layers may be greater as being more remote from the active layer 5 (t1<t2<t3, . . . , tN).

Further, the configuration of the semiconductor laser 1 of the other embodiment in FIG. 14 in which the refractive index nN of the outermost layer 4N of the first SCH layer 4 is set to be lower than the refractive index na of the n-type cladding layer 3 made of InGaAsP can be applied as a partially modified form of the refractive index characteristic (ns−n1>n1−n2>n2−n3>, . . . , >nN−nb>nN−na) of the semiconductor laser 1 in the other embodiment shown in FIG. 10, being set so that the refractive index difference between mutually adjacent layers among the plural layers for composing the first SCH layer 4 and second SCH layer 6 is smaller as going away from the active layer 5 (ns−n1>n1−n2>n2−n3>, . . . , >nN−nb>nN−na), and being set so that the thicknesses of the layers is greater as being more remote from the active layer 5 (t1<t2<t3, . . . , <tN).

In this semiconductor laser 1, the bandgap wavelength of InGaAsP for composing the n-type cladding layer 3 is 0.97 µm. However, in the semiconductor laser 1 of the invention, by selecting the bandgap wavelength of InGaAsP in a range of 0.96 to 0.98 µm, the width of the active layer 5 can be set at 7 to 14 µm.

In the semiconductor laser 1 of the invention, by selecting the bandgap wavelength of InGaAsP in a range of 0.96 to 0.98 µm, the laser light of high output can be applied into the single mode optical fiber while maintaining the fundamental lateral mode at the time of optical coupling with the single mode optical fiber.

FIG. 15 is a schematic diagram of optical coupling of the semiconductor laser 1 of the invention with an external single mode optical fiber 31.

In FIG. 15, the single mode optical fiber 31 has an anti-reflective (AR) film 32 formed on a light incident plane 31a.

As an example of optical coupling of the semiconductor laser 1 of the invention with the external single mode optical fiber 31, as indicated by solid line in FIG. 15, the central axis of the laser light emitted from one end face of the semiconductor laser 1 (LR side 21 in FIG. 15) is matched as far as possible with the central axis of a core 31b of the light incident plane 31a of the single mode optical fiber 31, and the one end face of the semiconductor laser 1 having the LR side 21 is disposed closely to the light incident plane 31a of the single mode optical fiber 31 having the AR film 32 (coupling without a lens).

Another example of optical coupling of the semiconductor laser 1 of the invention with the external single mode optical fiber 31 is indicated by a broken line in FIG. 15, in which the central axis of the laser light emitted from one end face of the semiconductor laser 1 (LR side 21 in FIG. 15) is matched as far as possible with the central axis of the core 31b of the light incident plane 31a of the single mode optical fiber 31, and the one end face of the semiconductor laser 1 having the LR side 21 is disposed by abutting against the light incident plane 31a of the single mode optical fiber 31 having the AR film 32 (butt joint coupling).

As a result, the exit light from the LR side 21 of the active layer 5 of the semiconductor laser 1 is applied to the core 31b of the light incident plane 31a of the single mode optical fiber 31.

According to this configuration, by expanding the active layer width while maintaining the fundamental lateral mode, the semiconductor laser 1 and the single mode optical fiber 31 can be optically coupled at a high coupling efficiency.

In the foregoing semiconductor lasers, the first and second SCH layers 4, 6 are provided at both sides of the active layer 5. However, the invention can be also applied in another semiconductor light emitting device, as shown in FIG. 16, such as a semiconductor laser, an external resonator type semiconductor laser, and a light emitting diode (LED), in which both the cladding layers 3, 9 are adjacent to both sides of the active layer 5, without forming the first and second SCH layers 4, 6.

Thus, in the semiconductor laser 1 of the invention, by using four element materials (In, Ga, As, P) in the n-type cladding layer 3, the bandgap wavelength of the n-type cladding layer 3 is set at 0.96 to 0.98 μm, and the width of the active layer 5 is set at 7 to 14 μm.

Accordingly, in the semiconductor laser 1 of the invention, the active layer width is broader so as to be closer to the mode field diameter of the fiber, while maintaining the oscillation fundamental lateral mode. Therefore, for example, without using a lens, sufficient coupling efficiency with the single mode optical fiber is obtained, and the laser module can be lowered in cost.

In the semiconductor laser 1 of the invention, moreover, since it is not required to use the taper optical waveguide for converting the spot size of the laser light according to the core diameter of the single mode optical fiber as in the prior art disclosed in patent document 1, the device length can be shortened, and the device cost can be curtailed.

As described herein, the invention provides a semiconductor laser capable of coupling the laser light of high output with the single mode optical fiber at low cost and at high coupling efficiency, while maintaining the fundamental lateral mode, without requiring the lens and other spot size converters unlike the prior art, when optically coupling with the single mode optical fiber.

The invention claimed is:

1. A semiconductor laser comprising:
    a substrate made of InP;
    an active layer including a multiquantum well structure formed above the substrate, the active layer having a width and a thickness which are constant in a direction of a resonator length L, the width of the active layer being in a range of 7 to 14 μm; and
    an n-type cladding layer made of InGaAsP and a p-type cladding layer made of InP which are formed above the substrate with the active layer interposed therebetween, a bandgap wavelength of the InGaAsP of the n-type cladding layer being in a range between 0.96 μm and 0.98 μm,
    wherein the n-type cladding layer made of InGaAsP has a refractive index that is higher than a refractive index of the p-type cladding layer made of InP, so that distribution of light generated in the active layer is biased to the n-type cladding layer to suppress an increase of optical loss due to inter valance band absorption in the p-type cladding layer, and
    wherein light which oscillates only in a fundamental lateral mode to be emitted from an exit facet is configured to be optically coupled with an external single mode optical fiber without generation of a higher lateral mode, and the light emitted from the exit facet has a spot size such that a ratio of a horizontal size to a vertical size of the spot size is in a range of 1:0.65 to 1:1.35.

2. The semiconductor laser according to claim 1, wherein the light emitted from the exit facet is optically coupled with the external single mode optical fiber without using a lens.

3. The semiconductor laser according to claim 1, wherein the light emitted from the exit facet is optically coupled with the external single mode optical fiber by a butt joint.

4. The semiconductor laser according to claim 1, further comprising:
    a first separate confinement heterostructure (SCH) layer made of InGaAsP, which is formed between the active layer and the n-type cladding layer; and
    a second SCH layer made of InGaAsP, which is formed between the active layer and the p-type cladding layer.

5. The semiconductor laser according to claim 4, wherein the first SCH layer includes a multilayer structure formed of a plurality of layers, and
    the second SCH layer includes a multilayer structure formed of a plurality of layers.

6. The semiconductor laser according to claim 5, wherein:
    a refractive index of a plurality of partition layers in the active layer is ns;
    respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
    respective refractive idices of said plurality of layers in the second SCH layer are n1, n2, n3, . . . , nN, respectively, and respective thickness of said plurality of layers in the second SCH layer are t1, t2, t3, . . . , tN, respectively, sequentially from a side closer to the active layer;
    a refractive index of the n-type cladding layer is na;
    a refractive index of the p-type cladding layer in nb; and
    the following relationships are satisfied:

$t1=t2=t3=,\ldots,=tN$, $ns>n1>n2>n3>,\ldots,>nN>na>nb$, and $ns-n1>n1-n2>n2-n3>,\ldots,>nN-nb>nN-na$.

7. The semiconductor laser according to claim 5, wherein:
    a refractive index of a plurality of partition layers in the active layer is ns;
    respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
    respective refractive indices of said plurality of layers in the second SCH layer are n1, n2, n3, . . . , nN, respectively, and respective thickness of said plurality of layers in the second SCH layer are t1, t2, t3, . . . , tN, respectively, sequentially from a side closer to the active layer;
    a refractive index of the n-type cladding layer is na;
    a refractive index of the p-type cladding layer is nb; and
    the following relationships are satisfied:

$ns>n1>n2>n3>,\ldots,nN>na>nb$, $nN-nb>nN-na$, $ns-n1=n1-n2=n2-n3=,\ldots,=nN-nb$, and $t1<t2<t3,\ldots,<tN$.

8. The semiconductor laser according to claim 5, wherein:
    a refractive index of a plurality of partition layers in the active layer is ns;
    respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
    respective refractive indices of said plurality of layers in the second SCH layer are n1, n2, n3, . . . , nN, respectively, and respective thickness of said plurality of layers in the second SCH layer are t1, t2, t3, . . . , tN, respectively, sequentially from a side closer to the active layer;
a refractive index of the n-type cladding layer is na;
a refractive index of the p-type cladding layer in nb; and
the following relationships are satisfied:

$ns > n1 > n2 > n3 >, \ldots, > nN > na > nb,$ $ns-n1 > n1-n2 > n2-n3 >, \ldots, > nN-nb > nN-na,$ and $t1 < t2 < t3 <, \ldots, < tN.$ 9. The semiconductor laser according to claim 5, wherein:
a refractive index of a layer having a lowest refractive index among the layers forming the active layer is ns;
respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
respective refractive indices of said plurality of layers in the second SCH layer are n1, n2, n3, . . . , nN, respectively, and respective thichness of said plurality of layers in the second SCH layer are t1, t2, t3, . . . , tN, respectively, sequentially from the side closer to the active layer;
a refractive index of the n-type cladding layer is na;
a refractive index of the p-type cladding layer is nb; and
the following relationships are satisfied:

$t1 = t2 = t3 =, \ldots, = tN,$ $na > nN,$ and $ns-n1 > n1-n2 > n2-n3 >, \ldots, > n(N-1)-nN.$ 10. The semiconductor laser according to claim 5, wherein:
a refractive index of a layer having a lowest refractive index among the layers forming the active layer is ns;
respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
respective refractive indices of said plurality of layers in the second SCH layer are n1, n2, n3, . . . , nN, respectively, and respective thickness of said plurality of layers in the second SCH layer are t1, t2, t3, . . . , tN, respectively, sequentially from a side closer to the active layer;
a refractive index of the n-type cladding layer is na;
a refractive index of the p-type cladding layer is nb; and
the following relationships are satisfied:

$ns > n1 > n2 > n3 >, \ldots, > nN > nb,$ $na > nN,$ $ns-n1 = n1-n2 = n2-n3 =, \ldots, = nN-nb,$ and $t1 > t2 > t3 >, \ldots, > tN.$ 11. The semiconductor laser according to claim 5, wherein:
a refractive index of a layer having a lowest refractive index among the layers forming the active layer is ns;
respective refractive indices of said plurality of layers in the first SCH layer are n1, n2, n3, . . . , nN, respectively, and respective thickness of said plurality of layers in the first SCH layer are t1, t2, t3, . . . , tN, respectively, sequentially from a side closer to the active layer;
respective refractive indices of said plurality of layers in the second SCH layer are n1, n2, n3, . . . , nN, respectively, and respective thickness of said plurality of layers in the second SCH layer are t1, t2, t3, . . . , tN, respectively, sequentially from a side closer to the active layer;
a refractive index of the n-type cladding layer is na;
a refractive index of the p-type cladding layer is nb; and
the following relationships are satisfied:

$ns > n1 > n2 > n3 >, \ldots, > nN > nb,$ $na > nN,$ $ns-n1 > n1-n2 > n2-n3 >, \ldots, > n(N-1)-nN,$ and $t1 < t2 < t3 <, \ldots, < tN.$ 12. The semiconductor laser according to claim 4, wherein the semiconductor laser is formed in a buried heterostructure.

13. The semiconductor laser according to claim 12, wherein part of the n-type cladding layer, the first SCH layer, the active layer, the second SCH layer, and the p-type cladding layer are formed in a mesa shape, and
wherein the semiconductor laser further comprises:
a first buried layer made of p-type InP, which has a first side that is in contact with the semiconductor substrate or the n-type cladding layer at both sides of the mesa shape; and
a second buried layer made of n-type InP, which has a first side that is in contact with the p-type cladding layer, and a second side that is in contact with a second side of the first buried layer at both sides of the mesa shape.

14. The semiconductor laser according to claim 1, wherein the semiconductor laser is formed in a ridge structure.

15. The semiconductor laser according to claim 14, wherein the semiconductor substrate is n-type, the p-type cladding layer comprises a ridge structure portion at which substantially a center of an outer side of the p-type cladding layer is raised upward, and
wherein semiconductor laser further comprises:
a contact layer formed on an upper side of the ridge structure portion of the p-type cladding layer;
an insulating layer which has an opening portion above a center of the contact layer, and which is formed to cover the p-type cladding layer including the ridge structure portion; and
an electrode formed on a top of the insulating layer with a part thereof connected to the contact layer.

16. The semiconductor laser according to claim 1, wherein, the semiconductor substrate is n-type, the n-type cladding layer is formed beneath the active layer, and the p-type cladding layer is formed above the active layer.

17. The semiconductor laser according to claim 1, wherein, the semiconductor substrate is p-type, the n-type cladding layer is formed above the active layer, and the p-type cladding layer is formed beneath the active layer.

* * * * *